(12) United States Patent
Ueno et al.

(10) Patent No.: US 9,349,668 B2
(45) Date of Patent: May 24, 2016

(54) SEMICONDUCTOR DEVICE

(71) Applicant: TOYODA GOSEI CO., LTD., Kiyosu-shi, Aichi-ken (JP)

(72) Inventors: Yukihisa Ueno, Kiyosu (JP); Toru Oka, Kiyosu (JP); Kazuya Hasegawa, Kiyosu (JP)

(73) Assignee: TOYODA GOSEI CO., LTD., Aichi-pref. (JP)

( * ) Notice: Subject to any disclaimer, the term of this patent is extended or adjusted under 35 U.S.C. 154(b) by 0 days.

(21) Appl. No.: 14/323,065

(22) Filed: Jul. 3, 2014

(65) Prior Publication Data

US 2015/0021617 A1   Jan. 22, 2015

(30) Foreign Application Priority Data

Jul. 17, 2013   (JP) .................................. 2013-148168

(51) Int. Cl.
| | |
|---|---|
| *H01L 29/47* | (2006.01) |
| *H01L 29/80* | (2006.01) |
| *H01L 29/66* | (2006.01) |
| *H01L 23/31* | (2006.01) |
| *H01L 21/31* | (2006.01) |
| *H01L 29/20* | (2006.01) |
| *H01L 29/872* | (2006.01) |

(52) U.S. Cl.
CPC ........ *H01L 23/3171* (2013.01); *H01L 23/3192* (2013.01); *H01L 29/2003* (2013.01); *H01L 29/872* (2013.01); *H01L 2924/0002* (2013.01)

(58) Field of Classification Search
CPC .............. H01L 23/3171; H01L 29/475; H01L 29/2003; H01L 29/0692; H01L 29/66143; H01L 23/3192; H01L 23/3178; H01L 29/78
USPC ......... 257/76, 77, 98, 99, 192, 294, 411, 471, 257/E29.089, E29.091, E29.246, E21.403, 257/E21.409; 438/172, 570, 589, 604
See application file for complete search history.

(56) References Cited

U.S. PATENT DOCUMENTS

| | | | | |
|---|---|---|---|---|
| 2007/0164322 | A1* | 7/2007 | Smith et al. ................... | 257/256 |
| 2007/0241419 | A1* | 10/2007 | Green et al. .................. | 257/499 |
| 2009/0146186 | A1* | 6/2009 | Kub et al. ..................... | 257/194 |
| 2010/0159656 | A1 | 6/2010 | Nakata et al. | |
| 2011/0057232 | A1* | 3/2011 | Sheppard et al. ............. | 257/194 |
| 2013/0313576 | A1* | 11/2013 | Nakano .......................... | 257/77 |
| 2014/0239346 | A1* | 8/2014 | Green ................. | H01L 27/0629 257/192 |

FOREIGN PATENT DOCUMENTS

| | | |
|---|---|---|
| JP | 2008-198787 A | 8/2008 |
| JP | 2010-166040 A | 7/2010 |
| JP | 2011-077123 A | 4/2011 |

* cited by examiner

*Primary Examiner* — Dao H Nguyen
(74) *Attorney, Agent, or Firm* — Posz Law Group, PLC

(57) ABSTRACT

A semiconductor device includes; a semiconductor layer mainly made of GaN; a protective film provided to have electrical insulation property and configured to coat the semiconductor layer; and an electrode provided to have electrical conductivity and configured to form a Schottky junction with the semiconductor layer. The protective film includes: a first layer made of $Al_2O_3$ and arranged adjacent to the semiconductor layer; a second layer made of an electrical insulation material different from $Al_2O_3$ and formed on the first layer; and an opening structure formed to pass through the first layer and the second layer. The electrode is located inside of the opening structure.

14 Claims, 5 Drawing Sheets

SEMICONDUCTOR DEVICE

CROSS-REFERENCE TO RELATED APPLICATION

The present application claims priority from Japanese patent application P2013-148168 filed on Jul. 17, 2013, the entirety of disclosures of which is hereby incorporated by reference into this application.

BACKGROUND

1. Technical Field

The present invention relates to a semiconductor device.

2. Related Art

GaN-based semiconductor devices having one or more semiconductor layers mainly made of gallium nitride (GaN) have been known as one type of semiconductor devices (semiconductor elements). Some of the GaN-based semiconductor devices may serve as a Schottky barrier diode. In order to reduce the leak current on the interface of the semiconductor layer, relieve the potential crowding on the semiconductor layer and protect a junction surface between two semiconductor layers, a protective film is formed to coat the semiconductor layer in the GaN-based semiconductor device. The protective film is made of an electrical insulation material. In terms of reducing the potential damage of the semiconductor layer, wet etching is more preferable than dry etching for the etching process of the protective film.

JP 2008-198787A describes a protective film made of one type of electrical insulation material selected out of, for example, silicon dioxide ($SiO_2$) and aluminum oxide ($Al_2O_3$). JP 2011-77123A describes separately forming two layers of a protective film made of silicon nitride (SiN), in order to form an opening structure below the working limit by photolithography. JP 2010-166040A describes forming a protective film made of, for example, silicon dioxide ($SiO_2$) or silicon oxynitride (SiON) on a gate insulating film made of aluminum oxide ($Al_2O_3$), in order to suppress erosion of the gate insulating film during manufacture.

SUMMARY

According to an experiment performed by the inventors of the present invention, in terms of reducing the leak current, $Al_2O_3$ is effectively used as the electrical insulation material of the protective film in the GaN-based semiconductor device. Increasing the thickness of the protective film made of $A_2O_3$ to ensure the sufficient dielectric breakdown strength, however, causes a problem of etching failure (peel-off or drop-off of a resist mask) during processing by wet etching.

In the GaN-based semiconductor device, there is accordingly a need for providing the technique that achieves both improvement of the electrical properties and improvement of the workability of the protective film. With regard to the semiconductor device, there are also other needs of cost reduction, miniaturization, easy manufacturing, resource saving, improved usability and improved durability.

In order to solve at least part of the problems described above, the invention may be implemented by the following aspects.

(1) According to one aspect of the invention, there is provided a semiconductor device. The semiconductor device comprises: a semiconductor layer mainly made of gallium nitride (GaN); a protective film provided to have electrical insulation property and configured to coat the semiconductor layer; and an electrode provided to have electrical conductivity and configured to form a Schottky junction with the semiconductor layer. The protective film has: a first layer made of aluminum oxide ($Al_2O_3$) and arranged adjacent to the semiconductor layer; a second layer made of an electrical insulation material different from aluminum oxide ($Al_2O_3$) and formed on the first layer; and an opening structure formed to pass through the first layer and the second layer. The electrode is located inside of the opening structure. According to this aspect, the first layer serves to reduce the leak current on the interface of the semiconductor layer, whereas the second layer serves to reinforce the dielectric breakdown strength and thereby reduce the thickness required for the first layer. This accordingly achieves both improvement of the electrical properties and improvement of the workability of the protective film.

(2) According to one embodiment of the semiconductor device described above, the electrical insulation material of the second layer may be at least one of silicon dioxide ($SiO_2$), silicon nitride (SiN), silicon oxynitride (SiON), hafnium oxide ($HfO_2$), aluminum nitride (AlN), zirconium oxide ($ZrO_2$) and zirconium oxynitride (ZrON). According to this embodiment, application of silicon dioxide ($SiO_2$) for the electrical insulation material effectively improves the dielectric breakdown strength of the protective film Application of at least one of silicon dioxide ($SiO_2$), silicon nitride (SiN) and silicon oxynitride (SiON) for the electrical insulation material allows for selection between wet etching and dry etching as the technique of etching the second layer and thereby enhances the flexibility of the processing technique of the protective film. Selection of dry etching further improves the workability of the protective film. Application of at least one of hafnium oxide ($HfO_2$), aluminum nitride (AlN), zirconium oxide ($ZrO_2$) and zirconium oxynitride (ZrON) for the electrical insulation material effectively improves the function of the protective film that relieves the potential crowding.

(3) According to another embodiment of the semiconductor device described above, the first layer may have a thickness equal to or less than 500 nm. This embodiment effectively suppresses etching failure of the first layer by wet etching.

(4) According to another embodiment of the semiconductor device described above, a total thickness of the protective film including the first layer and the second layer may be equal to or greater than 400 nm. This embodiment ensures the sufficient electrical properties of the protective film.

(5) According to another embodiment of the semiconductor device described above, a surface of the first layer that defines part of the opening structure may be sloped outward from the opening structure from a semiconductor layer side to a second layer side. In this embodiment including the first layer having this sloped surface, the opening structure is formed by removing part of the first layer from the top of the semiconductor layer by wet etching. This suppresses the potential damage of the semiconductor layer, compared with the structure of removing part of the first layer by dry etching.

According to another aspect of the invention, there is provided a manufacturing method of a semiconductor device. The manufacturing method comprises: forming a semiconductor layer mainly made of gallium nitride (GaN); forming a protective film configured to have electrical insulation property and coat the semiconductor layer; and forming an electrode configured to have electrical conductivity and form a Schottky junction with the semiconductor layer. The forming the protective film comprises: forming a first layer made of aluminum oxide ($Al_2O_3$) on the semiconductor layer; forming a second layer made of an electrical insulation material different from aluminum oxide ($Al_2O_3$) on the first layer; and forming by wet etching an opening structure configured to pass through the first layer and the second layer and arranged to cause the electrode to be located inside of the opening. This aspect achieves both improvement of the electrical properties and improvement of the workability of the protective film.

The invention may be implemented by any of various aspects other than the semiconductor device and the manufacturing method thereof: for example, an electrical apparatus including the semiconductor device described above and a manufacturing apparatus for manufacturing the semiconductor device described above.

According to any of the aspects of the invention described above, the first layer serves to reduce the leak current on the interface of the semiconductor layer, whereas the second layer serves to reinforce the dielectric breakdown strength and thereby reduce the film thickness required for the first layer. This accordingly achieves both improvement of the electrical properties and improvement of the workability of the protective film.

BRIEF DESCRIPTION OF DRAWINGS

The invention will be described with reference to the accompanying drawings in which.

DESCRIPTION OF EMBODIMENTS

A. First Embodiment

A-1. Configuration of Semiconductor Device

Figure 1:
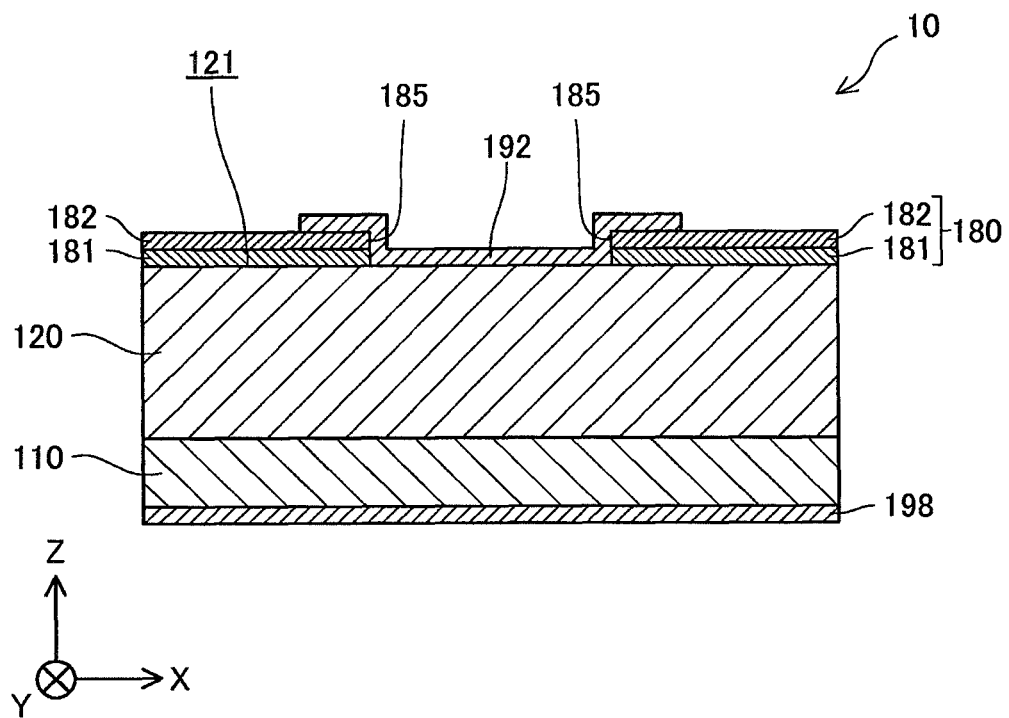
FIG. 1 is a cross sectional view schematically illustrating the configuration of a semiconductor device according to a first embodiment.

FIG. 1 is a cross sectional view schematically illustrating the configuration of a semiconductor device 10 according to a first embodiment. X, Y and Z axes orthogonal to one another are shown in FIG. 1.

Among the XYZ axes shown in FIG. 1, the X axis is an axis from the left side of the sheet surface to the right side of the sheet surface; +X-axis direction represents a direction toward the right side of the sheet surface; and −X-axis direction represents a direction toward the left side of the sheet surface. Among the XYZ axes shown in FIG. 1, the Y axis is an axis from the front side of the sheet surface to the back side of the sheet surface; +Y axis direction represents a direction toward the back side of the sheet surface; and −Y-axis direction represents a direction toward the front side of the sheet surface. Among the XYZ axes shown in FIG. 1, the Z axis is an axis from the bottom of the sheet surface to the top of the sheet surface; +Z-axis direction represents a direction toward the top of the sheet surface; and −Z-axis direction represents a direction toward the bottom of the sheet surface.

The semiconductor device 10 is a GaN-based semiconductor device formed using gallium nitride (GaN). According to this embodiment, the semiconductor device 10 is a vertical Schottky barrier diode. The semiconductor device 10 includes a substrate 110, a semiconductor layer 120, a protective film 180, a Schottky electrode 192 and a back electrode 198.

The substrate 110 of the semiconductor device 10 is a semiconductor layer formed in a plate-like shape extended along the X axis and the Y axis. According to this embodiment, the substrate 110 is an n-type semiconductor layer which is mainly made of gallium nitride (GaN) and contains silicon (Si) as the donor.

The semiconductor layer 120 of the semiconductor device 10 is an n-type semiconductor layer formed in a plate-like shape extended along the X axis and the Y axis. According to this embodiment, the semiconductor layer 120 is mainly made of gallium nitride (GaN) and contains silicon (Si) as the donor. The semiconductor layer 120 is formed on the +Z-axis direction side of the substrate 110. The semiconductor layer 120 has an interface 121. The interface 121 is along an XY plane, which the semiconductor layer 120 is extended over, and faces the +Z-axis direction. At least part of the interface 121 may be curved or may be undulated.

The protective film 180 of the semiconductor device 10 has electrical insulation properties and is formed to coat the interface 121 of the semiconductor layer 120. According to this embodiment, the breakdown voltage required for the semiconductor device 10 is 600 V (volts), and the maximum voltage applied to the semiconductor layer 120 is 600 V. The thickness (length along the Z axis) of the protective film 180 is determined according to this specification, such that the protective film 180 has dielectric breakdown strength of 8 to 10 MV/cm (megavolts/centimeter). The thickness of the protective film 180 is preferably not less than 400 nm (nanometers). According to this embodiment, the thickness of the protective film 180 is set to 600 nm. The thickness of the protective film 180 may be, for example, 3 μm (micrometers) for the breakdown voltage of 3 kV (kilovolts), 50 μm for the breakdown voltage of 50 kV and 500 μm for the breakdown voltage of 500 kV. The protective film 180 has a first layer 181 and a second layer 182.

The first layer 181 of the protective film 180 is a layer made of aluminum oxide ($Al_2O_3$) and arranged adjacent to the interface 121 of the semiconductor layer 120. In terms of improving the workability of the protective film 180, the thickness of the first layer 181 is preferably not greater than 500 nm, is more preferably not greater than 300 nm and is furthermore preferably not greater than 100 nm. According to this embodiment, the thickness of the first layer 181 is 100 nm. The thickness of the first layer 181 may be about 1 nm, which is a limit value for practically controlling deposition of the first layer 181.

The second layer 182 of the protective film 180 is a layer made of an electrical insulation material different from aluminum oxide ($Al_2O_3$) and formed on the first layer 181. According to this embodiment, the second layer 182 is made of silicon dioxide ($SiO_2$). According to this embodiment, the thickness of the second layer 182 is 500 nm.

The protective film 180 has an opening structure 185 formed to pass through the first layer 181 and the second layer 182. The opening structure 185 is formed by removing at least the first layer 181 from the top of the interface 121 of the semiconductor layer 120 by wet etching in the process of removing the protective film 180 from the top of the interface 121 of the semiconductor layer 120 to expose the interface 121.

The Schottky electrode 192 of the semiconductor device 10 is an electrode which has electrical conductivity and forms a Schottky junction with the interface 121 of the semiconductor layer 120. According to this embodiment, the Schottky electrode 192 is made of nickel (Ni). The Schottky electrode 192 is located inside of the opening structure 185 of the protective film 180. According to this embodiment, the Schottky electrode 192 is a conductive layer extended from the interface 121 of the semiconductor layer 120 inside of the opening structure 185 of the protective film 180 beyond the opening structure 185 of the protective film 180 to the +Z-axis direction side of the protective film 180. The Schottky electrode 192 and the semiconductor layer 120 accordingly form a field plate structure across the protective film 180.

The back electrode 198 of the semiconductor device 10 is an electrode which has electrical conductivity and forms an ohmic junction with the −Z-axis direction side of the substrate 110. According to this embodiment, the back electrode 198 is an electrode formed by laminating an aluminum (Al)-based layer on a titanium (Ti)-based layer and subsequently alloying the layered structure by firing.

A-2. Manufacturing Method of Semiconductor Device

Figure 2:
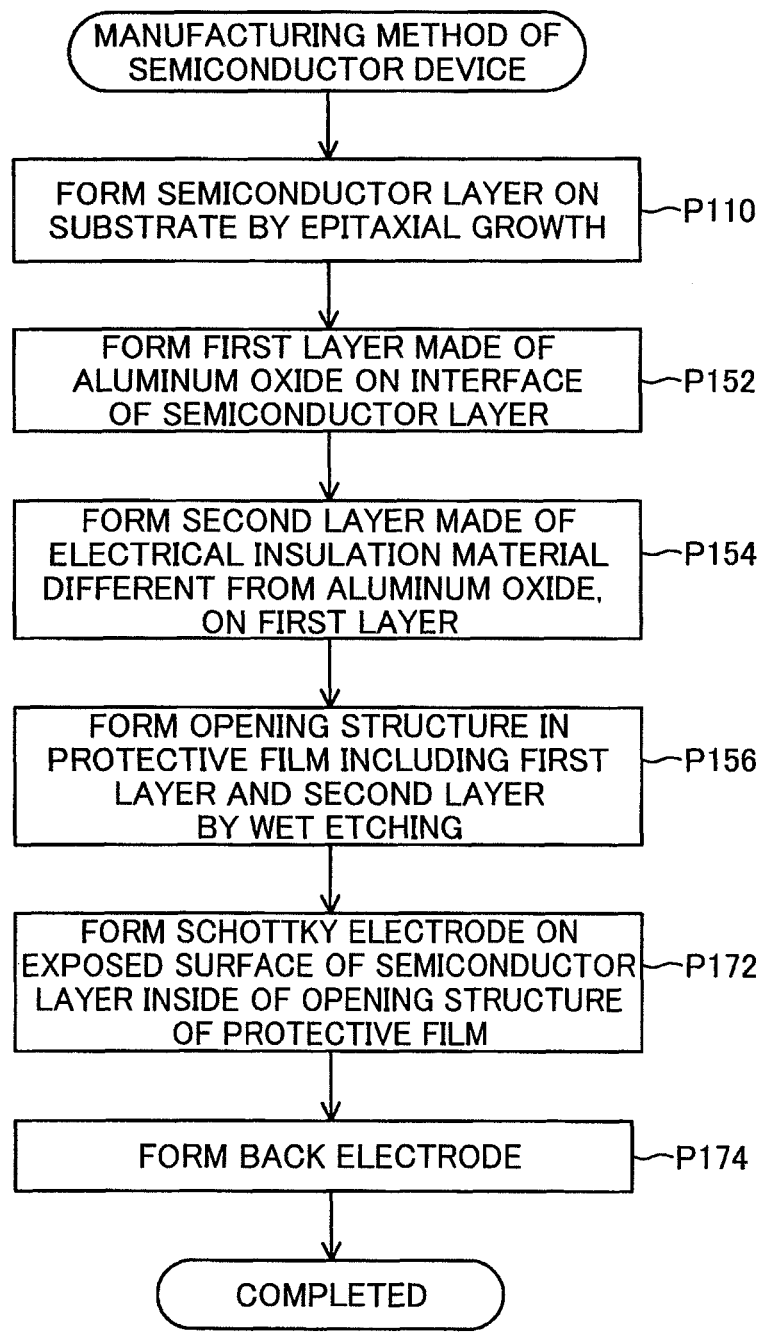
FIG. 2 is a flowchart showing a manufacturing method of the semiconductor device according to the first embodiment.

FIG. 2 is a flowchart showing a manufacturing method of the semiconductor device 10. According to the manufacturing method of the semiconductor device 10, the manufacturer forms the semiconductor layer 120 on the substrate 110 by epitaxial growth (step P110). According to this embodiment, the manufacturer forms the semiconductor layer 120 on the substrate 110 by epitaxial growth using an MOCVD apparatus for metalorganic chemical vapor deposition (MOCVD).

After forming the semiconductor layer 120 (step P110), the manufacturer forms the first layer 181 made of aluminum oxide ($Al_2O_3$) on the interface 121 of the semiconductor layer 120 (step P152). According to this embodiment, the manufacturer forms the first layer 181 by ALD (atomic layer deposition) method.

After forming the first layer 181 (step P152), the manufacturer forms the second layer 182 made of the electrical insulation material different from aluminum oxide ($Al_2O_3$) on the first layer 181 (step P154). This completes formation of the protective film 180 on the semiconductor layer 120. According to this embodiment, the manufacturer forms the second layer 182 made of silicon dioxide ($SiO_2$). According to this embodiment, the manufacturer forms the second layer 182 by chemical vapor deposition (CVD) method.

After forming the second layer 182 (step P154), the manufacturer forms the opening structure 185 in the protective film 180 including the first layer 181 and the second layer 182 by wet etching (step P156). According to this embodiment, the manufacturer removes specific parts of the first layer 181 and the second layer 182 by wet etching to form the opening structure 185. According to this embodiment, an etching solution used for formation of the opening structure 185 is a hydrofluoric acid mixed solution prepared at a mixing rate of hydrofluoric acid (HF):buffered hydrofluoric acid (BHF):water=1:4:100. According to this embodiment, the processing rate of wet etching for the first layer 181 and the second layer 182 is 40 to 60 nm/minute.

Figure 6:
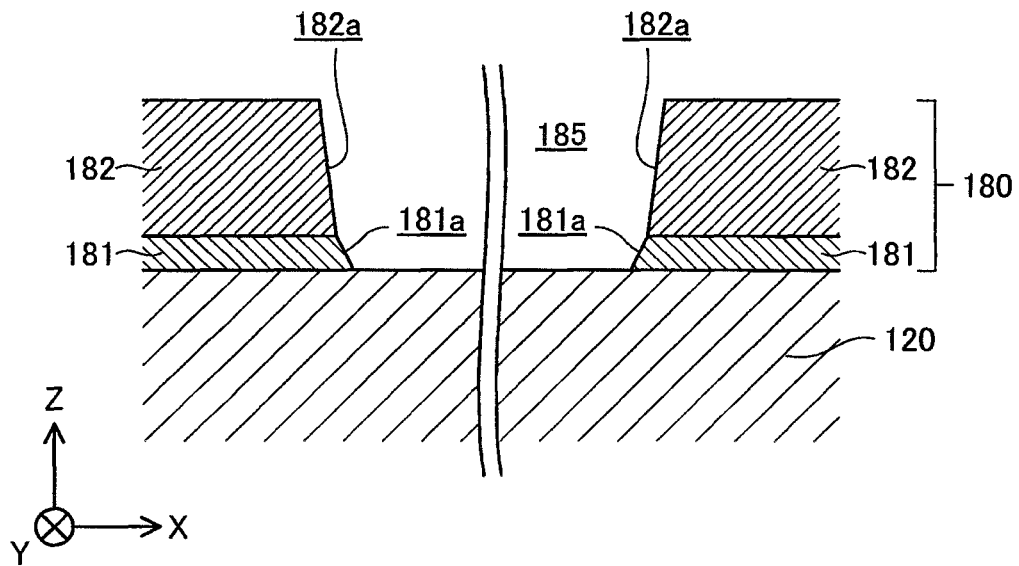
FIG. 6 is a diagram illustrating the configuration detail of an opening structure.

FIG. 6 is a diagram illustrating the configuration detail of the opening structure 185. According to this embodiment, the opening structure 185 is formed by processing the first layer 181 and the second layer 182 by isotropic wet etching. The first layer 181 has a surface 181a defining part of the opening structure 185. The second layer 182 has a surface 182a defining part of the opening structure 185. The surface 181a of the first layer 181 is formed by isotropic wet etching, so as to be sloped outward from the opening structure 185 from the −Z-axis direction side to the +Z-axis direction side (i.e., from the semiconductor layer 120-side to the second layer 182-side). The surface 182a of the second layer 182 is formed by isotropic wet etching, so as to be sloped outward from the opening structure 185 from the −Z-axis direction side to the +Z-axis direction side.

Figure 7:
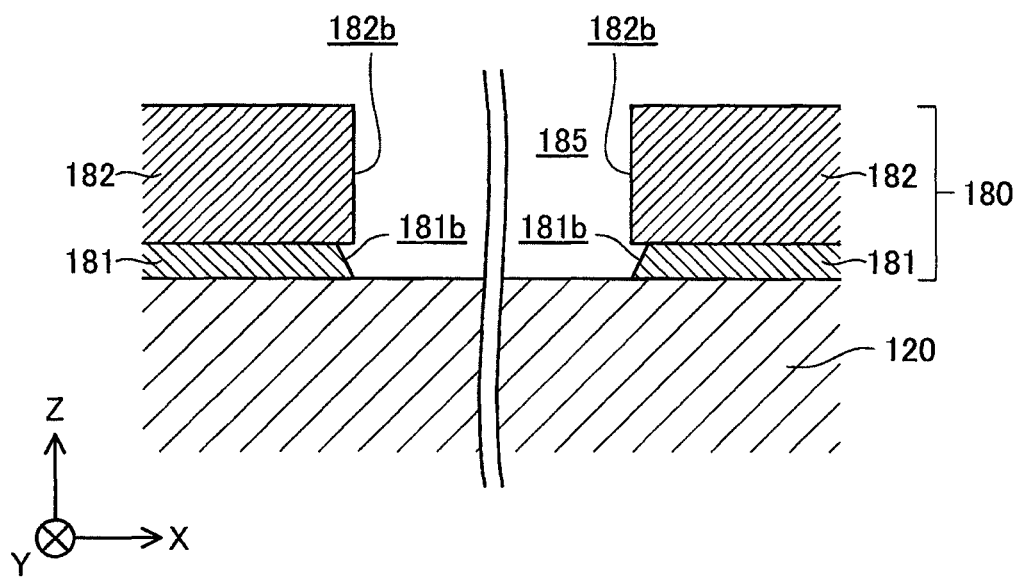
FIG. 7 is a diagram illustrating the configuration detail of the opening structure according to another embodiment.

FIG. 7 is a diagram illustrating the configuration detail of the opening structure 185 according to another embodiment. According to another embodiment, the opening structure 185 may be formed by processing the second layer 182 by anisotropic dry etching and subsequently processing the first layer 181 by isotropic wet etching. The first layer 181 has a surface 181b defining part of the opening structure 185. The second layer 182 has a surface 182b defining part of the opening structure 185. The surface 181b of the first layer 181 is formed by isotropic wet etching, so as to be sloped outward from the opening structure 185 from the −Z-axis direction side to the +Z-axis direction side (i.e., from the semiconductor layer 120-side to the second layer 182-side). The surface 182b of the second layer 182 is formed by anisotropic dry etching, so as to be almost parallel to the Z axis which is the thickness direction of the second layer 182.

Referring back to FIG. 2, after forming the opening structure 185 (step P156), the manufacturer forms the Schottky electrode 192 on the exposed interface 191 of the semiconductor layer 120 inside of the opening structure 185 of the protective film 180 (step P172). According to this embodiment, the manufacturer forms the Schottky electrode 192 made of nickel (Ni) by lift-off method. More specifically, the manufacturer forms a mask on the protective film 180 by photolithography, subsequently deposits nickel on the protective film 180 with the mask and then removes the mask from the protective film 180 to leave the Schottky electrode 192. According to this embodiment, the manufacturer forms the Schottky electrode 192 which is extended from the interface 121 of the semiconductor layer 120 inside of the opening structure 185 of the protective film 180 beyond the opening structure 185 of the protective film 180 to the +Z-axis direction side of the protective film 180.

After forming the Schottky electrode 192 (step P172), the manufacturer forms the back electrode 198 on the −Z-axis direction side of the substrate 110 (step P174). According to this embodiment, the manufacturer forms a layer made of titanium (Ti) on the −Z-axis direction side of the substrate 110 by vapor deposition, additionally forms a layer made of aluminum (Al) on the titanium layer by vapor deposition and alloys these layers by firing, so as to form the back electrode 198.

The semiconductor device 10 is completed by the above series of steps. A procedure according to another embodiment may perform the step of forming the back electrode 198 (step P174) prior to the step of forming the Schottky electrode 192 (step P172).

A-3. Evaluation of Semiconductor Device

Figure 3:
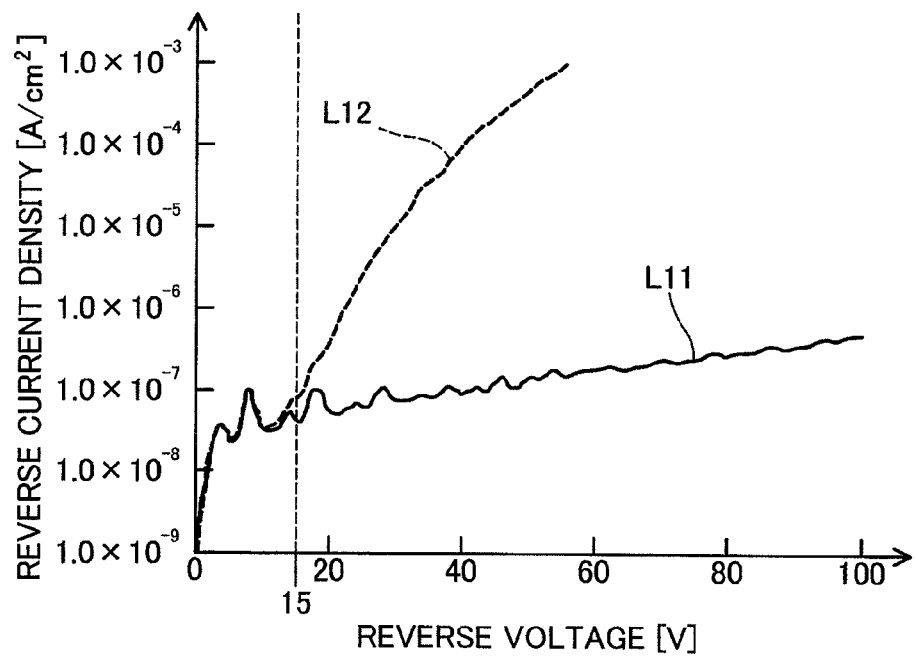
FIG. 3 is a graph showing the results of evaluation of a protective film.

FIG. 3 is a graph showing the results of evaluation of the protective film 180. In the evaluation test of FIG. 3, the examiner has provided a first specimen and a second specimen as semiconductor devices and measured the reverse current density under application of a reverse voltage on each specimen. The first specimen is the semiconductor device 10 described above. The second specimen has a similar configuration to that of the semiconductor device 10 except that the protective film 180 is replaced by an insulating film made of silicon dioxide ($SiO_2$). The insulating film of the second specimen has a single-layer structure and has the thickness of 600 nm.

The graph of FIG. 3 is a single logarithmic chart showing the reverse current density of each specimen against the reverse voltage. The graph of FIG. 3 has the reverse voltage as abscissa and the reverse current density on the logarithmic scale as ordinate. In the graph of FIG. 3, a solid-line plot L11 shows the measured values of the first specimen, and a broken-line plot L12 shows the measured values of the second specimen.

According to the evaluation results of FIG. 3, the first specimen more effectively reduces the reverse current density than the second specimen at the reverse voltages of and above 15 V. In other words, the first specimen more effectively reduces the leak current than the second specimen.

A-4. Advantageous Effects

In the first embodiment described above, the first layer 181 made of $Al_2O_3$ serves to reduce the leak current on the interface 121 of the semiconductor layer 120, whereas the second layer 182 made of $SiO_2$ serves to reinforce the dielectric breakdown strength and thereby reduce the thickness required for the first layer 181. This accordingly achieves both improvement of the electrical properties and improvement of the workability of the protective film 180.

Application of $SiO_2$ for the electrical insulation material of the second layer 182 effectively improves the dielectric breakdown strength of the insulating film. Application of $SiO_2$ for the electrical insulation material of the second layer 182 also allows for selection between wet etching and dry etching as the technique of etching the second layer 182 and thereby enhances the flexibility of the processing technique of the protective film 180. Selection of dry etching further improves the workability of the protective film 180.

The thickness of the first layer 181 is not greater than 500 nm. This effectively suppresses etching failure of the first layer 181 by wet etching.

The opening structure 185 is formed by removing part of the first layer 181 from the top of the semiconductor layer 120 by wet etching. This suppresses the potential damage of the semiconductor layer 120, compared with the method of removing part of the first layer 181 by dry etching.

B. Second Embodiment

B-1. Configuration of Semiconductor Device

Figure 4:
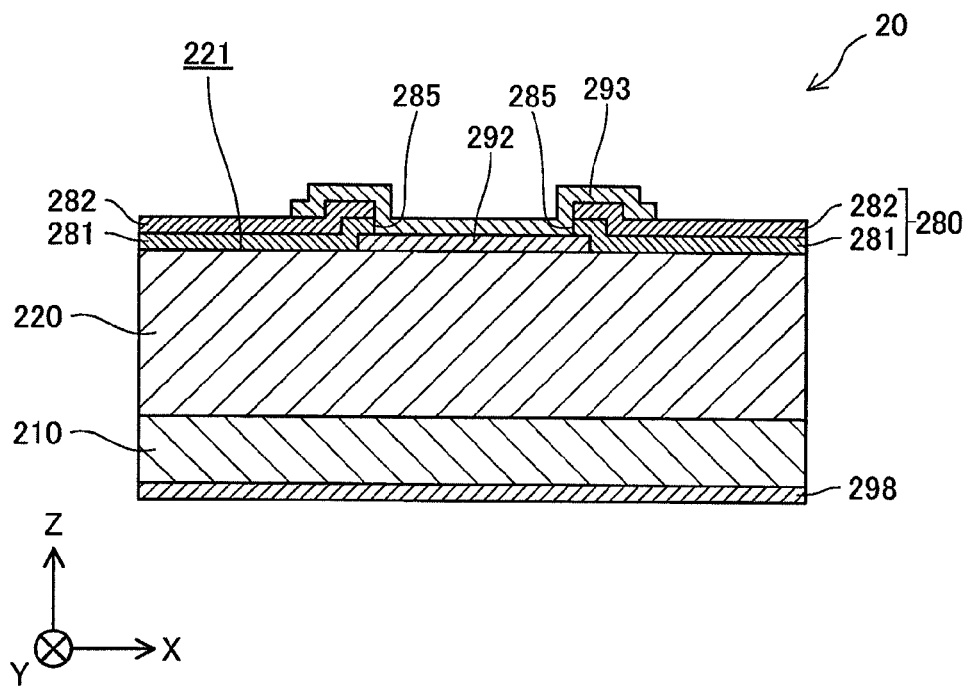
FIG. 4 is a cross sectional view schematically illustrating the configuration of a semiconductor device according to a second embodiment.

FIG. 4 is a cross sectional view schematically illustrating the configuration of a semiconductor device 20 according to a second embodiment. The X, Y and Z axes are also shown in FIG. 4, like FIG. 1.

The semiconductor device 20 is a GaN-based semiconductor device. According to this embodiment, the semiconductor device 20 is a vertical Schottky barrier diode. The configuration of the semiconductor device 20 of the second embodiment is similar to the configuration of the semiconductor device 10 of the first embodiment, except the configuration of a protective film and a Schottky electrode. The semiconductor device 20 includes a substrate 210, a semiconductor layer 220, a protective film 280, a Schottky electrode 292, a field plate electrode 293 and a back electrode 298.

The substrate 210 of the semiconductor device 20 is similar to the substrate 110 of the first embodiment. The semiconductor layer 220 of the semiconductor device 20 is similar to the semiconductor layer 120 of the first embodiment. The semiconductor layer 220 is formed on the +Z-axis direction side of the substrate 110. The semiconductor layer 220 has an interface 221. The interface 221 is along an XY plane, which the semiconductor layer 220 is extended over, and faces the +Z-axis direction. At least part of the interface 221 may be curved or may be concave and/or convex.

The protective film 280 of the semiconductor device 20 has electrical insulation properties and is formed to coat the interface 221 of the semiconductor layer 220. According to this embodiment, the protective film 280 is extended from the top of the interface 221 of the semiconductor layer 220 to a +Z-axis direction side edge of the Schottky electrode 292. The thickness of the protective film 280 is preferably not less than 400 nm. According to this embodiment, the thickness of the protective film 280 is set to 600 nm, like the protective film 180 of the first embodiment. The thickness of the protective film 280 may be, for example, 3 μm for the breakdown voltage of 3 kV, 50 μm for the breakdown voltage of 50 kV and 500 μm for the breakdown voltage of 500 kV. The protective film 280 has a first layer 281 and a second layer 282.

The first layer 281 of the protective film 280 is a layer made of aluminum oxide ($Al_2O_3$) and arranged adjacent to the interface 221 of the semiconductor layer 220. In terms of improving the workability of the protective film 280, the thickness of the first layer 281 is preferably not greater than 500 nm, is more preferably not greater than 300 nm and is furthermore preferably not greater than 100 nm. According to this embodiment, the thickness of the first layer 281 is 100 nm. The thickness of the first layer 281 may be about 1 nm, which is a limit value for practically controlling deposition of the first layer 281.

The second layer 282 of the protective film 280 is a layer made of an electrical insulation material different from aluminum oxide ($Al_2O_3$) and formed on the first layer 281. According to this embodiment, the second layer 282 is made of silicon dioxide ($SiO_2$). According to this embodiment, the thickness of the second layer 282 is 500 nm.

The protective film 280 has an opening structure 285 formed to pass through the first layer 281 and the second layer 282. The opening structure 285 is formed by removing at least the first layer 281 from the top of the Schottky electrode 292 by wet etching in the process of removing the protective film 280 from the top of the Schottky electrode 292 to expose the Schottky electrode 292.

The Schottky electrode 292 of the semiconductor device 20 is an electrode which has electrical conductivity and forms a Schottky junction with the interface 221 of the semiconductor layer 220. The Schottky electrode 292 is provided on the −Z-axis direction side of the opening structure 285 and is wider in the X-axis direction than the opening structure 285. A center part of the Schottky electrode 292 in the X-axis direction is located inside of the opening structure 285 of the protective film 280 and is adjacent to the field plate electrode 293 on the +Z-axis direction side. According to this embodiment, the Schottky electrode 292 is made of nickel (Ni).

The field plate electrode 293 of the semiconductor device 20 is an electrode which has electrical conductivity and is extended from the top of the Schottky electrode 292 inside of the opening structure 285 of the protective film 280 beyond the opening structure 285 of the protective film 280 to the +Z-axis direction side of the protective film 280. The field plate electrode 293 and the semiconductor layer 220 accordingly form a field plate structure across the protective film 280. According to this embodiment, the field plate electrode 293 is made of nickel (Ni).

The back electrode 298 of the semiconductor device 20 is similar to the back electrode 198 of the first embodiment. The back electrode 298 forms an ohmic junction with the −Z-axis direction side of the substrate 210.

B-2. Manufacturing Method of Semiconductor Device

Figure 5:
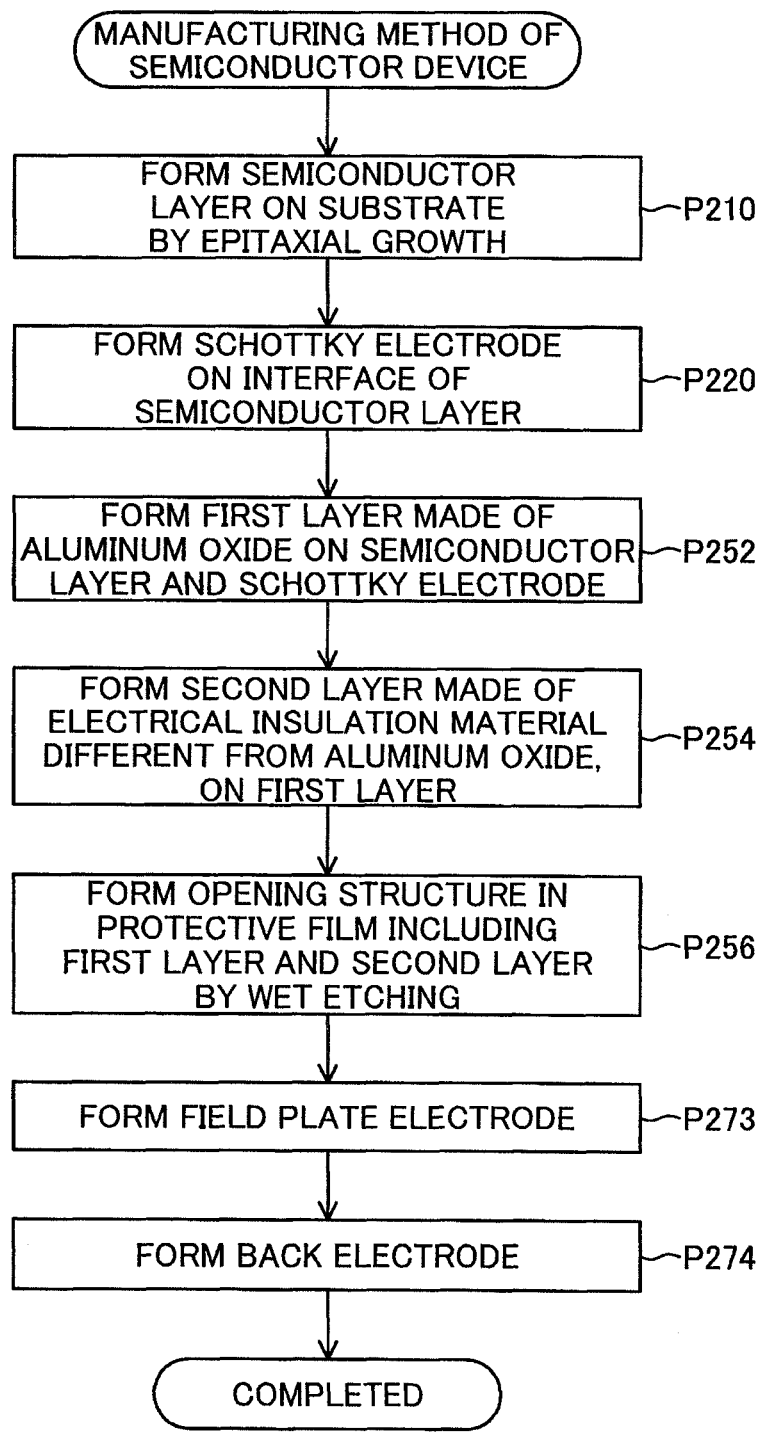
FIG. 5 is a flowchart showing a manufacturing method of the semiconductor device according to the second embodiment.

FIG. 5 is a flowchart showing a manufacturing method of the semiconductor device 20. According to the manufacturing method of the semiconductor device 20, the manufacturer forms the semiconductor layer 220 on the substrate 210 by epitaxial growth (step P210), like the semiconductor layer 120 of the first embodiment.

After forming the semiconductor layer 220 (step P210), the manufacturer forms the Schottky electrode 292 on the interface 221 of the semiconductor layer 220 (step P220). According to this embodiment, the manufacturer forms a mask on the interface 221 of the semiconductor layer 220 by photolithography and subsequently forms the Schottky electrode 292 made of nickel (Ni) by vapor deposition.

After forming the Schottky electrode 292 (step P220), the manufacturer forms the first layer 281 made of aluminum oxide ($Al_2O_3$) from the top of the interface 221 of the semiconductor layer 220 to the top of the Schottky electrode 292 (step P252). According to this embodiment, the manufacturer forms the first layer 281 by the ALD method.

After forming the first layer 281 (step P252), the manufacturer forms the second layer 282 made of the electrical insulation material different from aluminum oxide ($Al_2O_3$) on the first layer 281 (step P254). This completes formation of the protective film 280 on the semiconductor layer 220 and the Schottky electrode 292. According to this embodiment, the manufacturer forms the second layer 282 made of silicon dioxide ($SiO_2$). According to this embodiment, the manufacturer forms the second layer 282 by the CVD method.

After forming the second layer 282 (step P254), the manufacturer forms the opening structure 285 in the protective film 280 including the first layer 281 and the second layer 282 by wet etching (step P256). According to this embodiment, the manufacturer removes specific parts of the first layer 281 and the second layer 282 by wet etching to form the opening structure 285. An etching solution used for formation of the opening structure 285 according to this embodiment is a hydrofluoric acid mixed solution similar to that described in the first embodiment. According to this embodiment, the processing rate of wet etching of the first layer 281 and the second layer 282 is 40 to 60 nm/minute. The configuration detail of the opening structure 285 is similar to that of the opening structure 185 of the first embodiment described with reference to FIGS. 6 and 7.

After forming the opening structure 285 (step P256), the manufacturer forms the field plate electrode 293 which is extended from the top of the exposed Schottky electrode 292 inside of the opening structure 285 of the protective film 280 beyond the opening structure 285 of the protective film 280 to the +Z-axis direction side of the protective film 280 (step P273). According to this embodiment, the manufacturer forms a mask on the protective film 280 by photolithography and subsequently forms the field plate electrode 283 made of nickel (Ni) by vapor deposition.

After forming the field plate electrode 293 (step P273), the manufacturer forms the back electrode 298 on the −Z-axis direction side of the substrate 210 (step P274), like the back electrode 198 of the first embodiment.

The semiconductor device 20 is completed by the above series of steps. A procedure according to another embodiment may perform the step of forming the back electrode 298 (step P274), prior to the step of forming the Schottky electrode (step P220) and the step of forming the field plate electrode 293 (step P273).

B-3. Advantageous Effects

Like the first embodiment, in the second embodiment described above, the first layer 281 made of $Al_2O_3$ serves to reduce the leak current on the interface 221 of the semiconductor layer 220, whereas the second layer 282 made of $SiO_2$ serves to reinforce the dielectric breakdown strength and thereby reduce the thickness required for the first layer 281. This accordingly achieves both improvement of the electrical properties and improvement of the workability of the protective film 280.

C. Other Embodiments

The invention is not limited to the above embodiments, examples or modifications, but a diversity of variations and modifications may be made to the embodiments without departing from the scope of the invention. For example, the technical features of the embodiments, examples or modifications corresponding to the technical features of the respective aspects described in SUMMARY OF INVENTION may be replaced or combined appropriately, in order to solve part or all of the problems described above or in order to achieve part or all of the advantageous effects described above. Any of the technical features may be omitted appropriately unless the technical feature is described as essential herein.

The insulating film of the above embodiment may be applied to an insulating film of a semiconductor device having a different configuration from that of the above embodiment.

According to the embodiments described above, the first layer of the protective film may be comprised of a plurality of layers that is equal to or greater than two. In the application of the first layer comprised of the plurality of layers, the total thickness of these layers is preferably not greater than 500 nm, is more preferably not greater than 300 nm and is furthermore preferably not greater than 100 nm.

According to the embodiments described above, the electrical insulation material of the second layer of the protective film may be at least one of silicon dioxide ($SiO_2$), silicon nitride (SiN), silicon oxynitride (SiON), hafnium oxide ($HfO_2$), aluminum nitride (AlN), zirconium oxide ($ZrO_2$) and zirconium oxynitride (ZrON). Application of at least one of $SiO_2$, SiN and SiON for the electrical insulation material of the second layer allows for selection between wet etching and dry etching as the technique of etching the second layer and thereby enhances the flexibility of the processing technique of the insulating film. Selection of dry etching further improves the workability of the protective film. Application of at least one of $HfO_2$, AlN, $ZrO_2$ and ZrON for the electrical insulation material of the second layer effectively improves the function of the insulating film that relieves the potential crowding.

According to the embodiments described above, the second layer of the protective film may be comprised of a plurality of layers that is equal to or greater than two. In the application of the second layer comprised of the plurality of layers, the materials of these layers may be an identical material or may be different materials.

According to the embodiments described above, the technique for forming the respective layers of the protective film is not limited to the ALD method but may be sputtering method.

According to the embodiments described above, the material of the substrate is not limited to gallium nitride (GaN) but may be, for example, silicon (Si), sapphire ($Al_2O_3$) or silicon carbide (SiC).

According to the embodiments described above, the donor contained in the n-type semiconductor layer is not limited to silicon (Si) but may be, for example, germanium (Ge) or oxygen (O).

According to the embodiments described above, the material of the Schottky electrode is not limited to nickel (Ni) but may be, for example, palladium (Pd), platinum (Pt) or gold (Au).

According to the embodiments described above, the material of the back electrode is not limited to the alloy of titanium (Ti) and aluminum (Al) but may be another metal.

What is claimed is:

1. A Schottky barrier diode comprising:
a semiconductor layer mainly made of gallium nitride (GaN);
a protective film provided to have electrical insulation property and configured to coat the semiconductor layer;
an electrode provided to have electrical conductivity and configured to form a Schottky junction with the semiconductor layer;
a field plate electrode provided on the electrode, the field plate electrode has electrical conductivity; and
a back electrode provided on a bottom side of the semiconductor layer opposite from the electrode, the back electrode has electrical conductivity and is configured to form an ohmic junction with the bottom side of the semiconductor layer,
wherein the protective film includes:
a first layer made of aluminum oxide ($Al_2O_3$) and arranged adjacent to the semiconductor layer;
a second layer made of an electrical insulation material different from aluminum oxide ($Al_2O_3$) and formed on the first layer without being adjacent to the semiconductor layer; and
an opening structure formed to pass through the first layer and the second layer,
wherein at least a part of the electrode is located inside of the opening structure, and at least one of the electrode and the field plate electrode is extended on the second layer.

2. The Schottky barrier diode according to claim 1, wherein the electrical insulation material of the second layer is at least one of silicon dioxide ($SiO_2$), silicon nitride (SiN), silicon oxynitride (SiON), hafnium oxide ($HfO_2$), aluminum nitride (AlN), zirconium oxide ($ZrO_2$) and zirconium oxynitride (ZrON).

3. The Schottky barrier diode according to claim 1, wherein a thickness of the first layer is equal to or less than 500 nm.

4. The Schottky barrier diode according to claim 1, wherein a total thickness of the protective film including the first layer and the second layer is equal to or greater than 400 nm.

5. The Schottky barrier diode according to claim 1, wherein a surface of the first layer that defines part of the opening structure is sloped outward from the opening structure from a semiconductor layer side to a second layer side.

6. The Schottky barrier diode according to claim 1, wherein a material of the back electrode includes an alloy of titanium (Ti) and aluminum (Al).

7. The Schottky barrier diode according to claim 1, wherein the field plate electrode provided on the electrode is in direct contact with the electrode.

8. A Schottky barrier diode comprising:
a semiconductor layer mainly made of gallium nitride (GaN);
an electrode provided to have electrical conductivity and configured to form a Schottky junction with the semiconductor layer; and
a protective film provided to have electronic insulation property and configured to coat the semiconductor layer, the protective film being extended on the electrode from the semiconductor layer,
wherein the protective film includes:
a first layer made of aluminum oxide ($Al_2O_3$) and arranged adjacent to the semiconductor layer;
a second layer made of an electrical insulation material different from aluminum oxide ($Al_2O_3$) and formed on the first layer without being adjacent to the semiconductor layer; and
an opening structure formed to pass through the first layer and the second layer where the protective film is extended on the electrode and so that the protective film sandwiches the electrode to the semiconductor layer.

9. The Schottky barrier diode according to claim 8, wherein the electrical insulation material of the second layer is at least one of silicon dioxide ($SiO_2$), silicon nitride (SiN), silicon oxynitride (SiON), hafnium oxide ($HfO_2$), aluminum nitride (AlN), zirconium oxide ($ZrO_2$) and zirconium oxynitride (ZrON).

10. The Schottky barrier diode according to claim 8, wherein a thickness of the first layer is equal to or less than 500 nm.

11. The Schottky barrier diode according to claim 8, wherein a total thickness of the protective film including the first layer and the second layer is equal to or greater than 400 nm.

12. The Schottky barrier diode according to claim 8, wherein a surface of the first layer that defines part of the opening structure is sloped outward from the opening structure from a semiconductor layer side to a second layer side.

13. The Schottky barrier diode according to claim 8, further comprising a back electrode provided on a bottom side of the semiconductor layer opposite from the electrode, the back electrode has electrical conductivity and is configured to form an ohmic junction with the bottom side of the semiconductor layer.

14. The Schottky barrier diode according to claim 13, wherein a material of the back electrode includes an alloy of titanium (Ti) and aluminum (Al).

* * * * *